United States Patent [19]
Shores

[11] Patent Number: 5,581,048
[45] Date of Patent: Dec. 3, 1996

[54] CORROSION RESISTANT ELECTROMAGNETIC SHIELDING GASKET

[75] Inventor: Marvin W. Shores, Pomona, Calif.

[73] Assignee: Hughes Missile Systems Company, Los Angeles, Calif.

[21] Appl. No.: 675,902

[22] Filed: Nov. 28, 1984

[51] Int. Cl.⁶ .............................. H05K 9/00; H05K 5/00; F16N 15/00
[52] U.S. Cl. .................. 174/35 GC; 174/17 CT; 184/98; 277/901
[58] Field of Search .......................... 174/17 CT, 35 GC, 174/35 MS; 184/88.1, 98, 99; 277/69, 77, 117–122, 228, 901, DIG. 6; 339/114, 115 R, 115 C, 116 R, 116 C, 97 A, 97 C

[56] References Cited

U.S. PATENT DOCUMENTS

| | | |
|---|---|---|
| 1,665,964 | 4/1928 | Koehler . |
| 2,047,730 | 7/1936 | Fleckenstein . |
| 2,065,558 | 12/1936 | Berryman ............................. 91/189 R |
| 2,068,530 | 1/1937 | Berryman . |
| 2,604,507 | 7/1952 | Tyson . |
| 2,846,495 | 8/1958 | Link . |
| 2,974,183 | 3/1961 | Kes et al. ............................ 174/35 GC |
| 3,026,367 | 3/1962 | Hartwell ................................. 301/123 |
| 3,304,360 | 2/1967 | Hadley et al. . |
| 3,413,406 | 11/1968 | Plummer ............................. 174/35 GC |
| 3,424,853 | 1/1969 | Johnson, III . |
| 4,247,737 | 1/1981 | Johnson et al. . |
| 4,334,259 | 6/1982 | Edwards . |
| 4,371,175 | 2/1983 | Van Dyk, Jr. . |

Primary Examiner—Gregory C. Issing
Attorney, Agent, or Firm—Charles D. Brown; Wanda K. Denson-Low

[57] ABSTRACT

A shielding gasket is disclosed which may be installed between a door panel and an enclosure containing electronic equipment therein, the shielding gasket providing excellent electromagnetic shielding effectiveness in the space between the door panel and the enclosure. The shielding gasket includes a retaining medium for holding a corrosion-inhibiting fluid, which is bled from the retaining medium onto the outer surface of the conductive gasket over an extended period of time to provide a protective film over the interfacing dissimilar metals of the shielding gasket and the enclosure. The shielding gasket may include an elastomeric gasket to provide a moisture-proof seal, or a rigid metallic strip to support the shielding gasket.

1 Claim, 2 Drawing Sheets

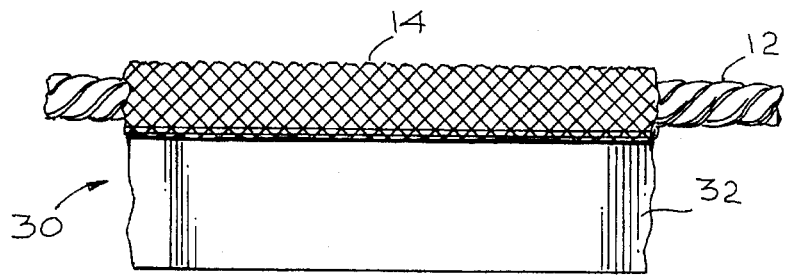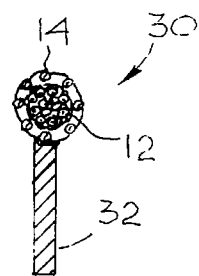
Fig. 5   Fig. 6
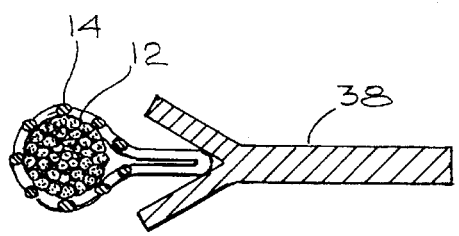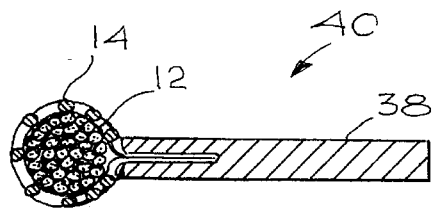
Fig. 7   Fig. 8
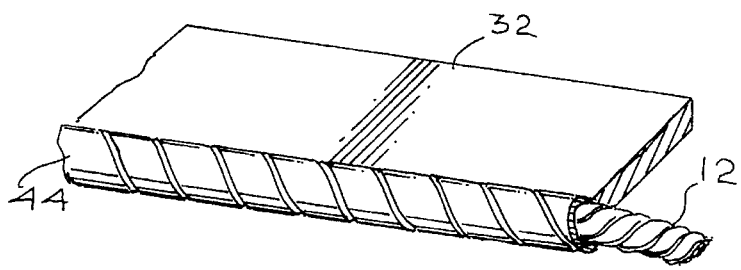
Fig. 9
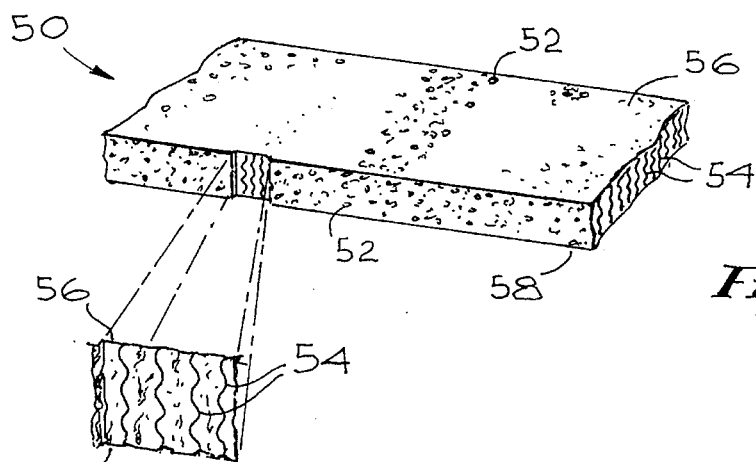
Fig. 10
Fig. 10A 5,581,048

CORROSION RESISTANT ELECTROMAGNETIC SHIELDING GASKET

The Government has rights in this invention pursuant to Contract No. N00024-82-C-7001, awarded by the U.S. Navy.

BACKGROUND OF THE INVENTION

1. Field of the Invention.

The present invention relates to electrically conductive enclosures for protecting sensitive electronic components from ambient electromagnetic fields and, more particularly, to arrangements for maintaining electrical continuity between such enclosures and associated doors, hatches, covers and the like which provide access to the interior of the enclosures.

2. Description of the Prior Art.

In many applications utilizing high technology electrical or electronic equipment, the sensitivity of such equipment to electromagnetic interference (EMI) mandates the installation of such equipment within a metal shielding enclosure to safeguard the equipment during operation in an electromagnetic field environment. It will be recognized that the reduction or virtual elimination of such electromagnetic interference becomes an all encompassing consideration, particularly in aerospace and military applications where failure to safeguard the electronic equipment from such electromagnetic interference would render the equipment inoperative, or possibly induce false signals causing erroneous information to be provided by the equipment.

Such electronic equipment is therefore typically installed into an electrically conductive metallic enclosure which will function as a shield against electromagnetic interference, with the typical enclosure being sealed by the installation of a door panel onto an opening in the enclosure, thereby providing access to the interior for service or maintenance. It will be recognized that the enclosure may require other apertures therein for electrical connections, cooling devices, or input/output interfaces for use with the equipment. Closing the one or more openings in the enclosure with a conductive door panel or panels may not ensure adequate shielding of electrical equipment contained within the enclosure because of the likelihood of loss of circuit continuity between the door panel and the enclosure. Even an extremely narrow aperture between the door panel and the enclosure or surface resistance from corrosion will interfere with the effectiveness of the enclosure as an electromagnetic shield.

The solution generally embraced by the art has been the use of a conductive gasket between the door panel and the enclosure, the conductive gasket being required to compressively deform as the door panel is fastened onto the enclosure to establish a pressure contact circuit path between the door panel and the enclosure. Such gaskets have included metallic wool or fabric, spring-loaded fingers, deformable curved gaskets made of thin spring stock, and tubular mesh gaskets, all of which may be flattened between the door panel and the enclosure to maximize electrical conductivity through the gasket material between the door panel and the enclosure. One of the more effective types of conductive gasket materials is the wire mesh type, which is also known as "knitted wire", and which is sufficiently resilient to firmly contact both the surface of the door panel and the surface of the enclosure when the door panel is fastened to the enclosure. Examples of such gaskets are shown in Johnson U.S. Pat. Nos. 3,424,853 and 4,247,737. Generally, such wire mesh or knitted wire gaskets do provide a continuous electrical contact between the access door panel and the enclosure which is effective for a limited period of time after installation. The problem with the knitted wire gaskets of the prior art stems primarily from the fact that the metals contained in such conductive gaskets are rarely compatible, galvanically, with the metals required for structurally sound enclosures.

Moreover, such wire mesh gaskets are particularly limited in effectiveness when used in a corrosive environment, such as a sea environment which would be encountered by installation of such equipment near the ocean, on an ocean-going vessel, or in aircraft based on a carrier. The metals contained in such conductive gaskets are attacked by galvanic action more rapidly in such a marine environment where they encounter moist salt air, salt spray and the like so that the effectiveness of the shielding provided by such enclosures is rapidly degraded.

A temporary solution to this problem is to utilize water repellent oil as a corrosion inhibitor by spraying or soaking the conductive gasket with oil before the door panel is fastened to the enclosure. Unfortunately, while this protective measure is initially quite effective in preventing corrosion, in only a relatively short time thereafter the oil must be replenished or corrosion will occur. Thus, this approach requires that the door panel be removed and the gasket be re-oiled periodically to provide effective protection against corrosion. Alternatively, if a rubber gasket is used in addition to the conductive metallic wire mesh gasket, there is a possibility that the conductive gasket may be oiled without removing the door panel from the enclosure; however, it is apparent that providing such periodic maintenance is a burden and it would be highly preferable to have a system affording longer protection without maintenance.

Historically, technology exists for providing oil from a reservoir to a location over an extended period of time. Such technology is displayed in Berryman U.S. Pat. Nos. 2,065,558 and 2,068,530, which disclose automobile battery clamps incorporating a small reservoir of oil with a wick utilized to draw the oil from the reservoir to the battery post. It will be immediately recognized that providing such reservoirs would be both expensive and impractical, inasmuch as the conductive gasket may be fairly lengthy depending on the size of the enclosure and the door panel. Thus, the system taught by Berryman is felt to be inadequate. It is therefore apparent that there exists a substantial need for a conductive gasket or similar element which will be corrosion-resistant and which will not require maintenance for extended periods of time. Such a conductive gasket must be rugged, easily maintained, and effective and reliable over extended periods of time. The gasket must be flexible, and should not interfere with sealing the door panel against the enclosure. Finally, it is desirable that all of the above features and advantages should be provided at minimal cost.

SUMMARY OF THE INVENTION

In brief, arrangements in accordance with the present invention incorporate prefabricated lubricated gasket members which are especially prepared to develop the desired electrical contact with adjacent surfaces of the shielding enclosure and associated door panel or the like and which are effective in continuously supplying the lubricant to these contact areas over an extended period of time, thereby preventing the development of corrosion which would interfere with the electrical circuit paths established by the conductive gasket member.

In its simplest version, one embodiment of the present invention comprises an oil retaining medium such as a wick within a section of tubular knitted wire. The assembly is initially saturated with water repellent oil before the installation of the conductive gasket between the door panel and the enclosure, and the oil retained by the conductive medium will bleed over an extended period of time, thereby maintaining a protective film over the interface between the dissimilar metals of the conductive gasket, the door panel and enclosure. In this manner, the conductive gasket of the present invention will prevent corrosion over an extended period of time without maintenance while affording an excellent shielding effect in the space between the door panel and the enclosure. Installation of the gasket is no different from previously known shielding gaskets, since it is merely inserted in the space between the door panel and the enclosure, after which the door panel is fastened to the enclosure, compressing the conductive gasket and assuring contiguous electrical contact between the gasket and the door panel and the enclosure.

Several alternative embodiments of the present invention may be utilized, and require only minor adaptations of the present invention. For example, an elastomeric strip may be longitudinally cemented to the tubular woven wire gasket to provide a moisture barrier as well as shielding the enclosure from electromagnetic interference. Should it be desirable to provide a more rigid gasket for ease in installing rather large gaskets, a Y-shaped strip of metal may be added to the basic embodiment of the present invention, with the two arms of the Y being squeezed shut while capturing a portion of the gasket therein, thus resulting in the conductive gasket being held by the rigid metal portion. Finally, the concept of the present invention may also be utilized with a conductive gasket made from a metallic material other than woven or knitted wire. For example, a compression gasket made by winding a thin, narrow metallic strip in a tubular configuration, thereby resulting in a spiral metallic shield, may be utilized with a conductive medium installed therein. Such a spiral type conductive gasket may require the use of an elastomeric strip bonded to the spiral metallic portion of the gasket to hold the spirals in position.

Any one of the embodiments of the present invention will provide excellent shielding effectiveness in the space between the door panel and the enclosure, while simultaneously safeguarding against corrosion for an extended period of time without maintenance. The use of the lubricant storing medium within the metallic portion of the gasket assembly is highly effective, and the lubricant may be easily replenished in the storage medium at the extended interval points. The present invention provides excellent shielding characteristics and high resistance to corrosion in a package which is quite inexpensive and easy to assemble. The conductive gasket assembly is not susceptible to mechanical damage or deterioration, and it does not require substantial force to seal the door panel to the enclosure. Thus, the present invention does not require complex construction, thereby resulting in an effective and efficient corrosion-resistant conductive gasket which may be economically manufactured and which requires minimal maintenance.

BRIEF DESCRIPTION OF THE DRAWING

A better understanding of the present invention may be had from a consideration of the following detailed description, taken in conjunction with the accompanying drawing in which:

FIG. 5 is a plan view of an embodiment of the present invention with an elastomeric strip longitudinally bonded to the conductive gasket;

FIG. 6 is a cross-sectional view of the embodiment of the present invention shown in FIG. 5;

FIG. 7 illustrates the technique used to manufacture a second alternative embodiment of the present invention with a Y-shaped strip being attached to the conductive gasket;

FIG. 8 is a cross-sectional view of the assembled conductive gasket of FIG. 7;

FIG. 9 is a perspective view of a portion of a third alternative embodiment of the present invention showing a segment of a spiral wound strip of metal in place of the knitted or woven mesh, which spiral segment is shown attached to an elastomeric strip; and FIGS. 10 and 10A represent schematically still another embodiment of the present invention.

DESCRIPTION OF THE PREFERRED EMBODIMENTS

Figure 1:
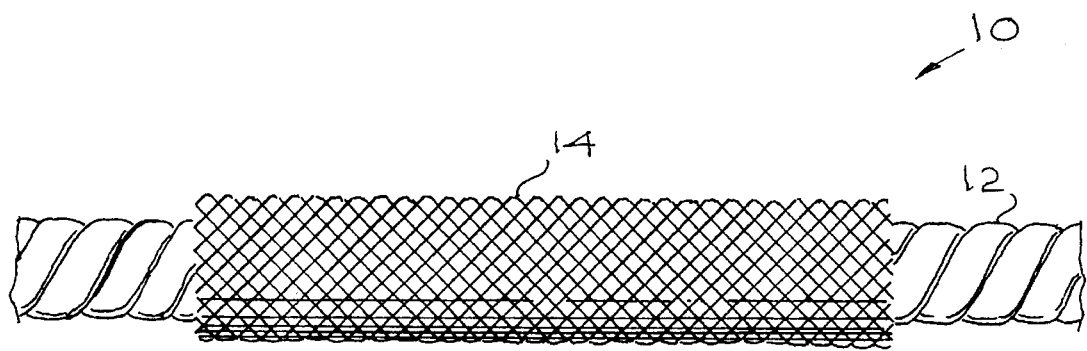
FIG. 1 is a plan view of one particular embodiment of the present invention.

In FIG. 1 one preferred embodiment of the present invention is illustrated, whereby a conductive gasket member 10 is manufactured by incorporating a corrosion-inhibiting fluid into a retaining medium 12, which retaining medium 12 is in turn installed into a conductive gasket 14. In FIG. 1, the retaining medium 12 is an oil retaining wick, which is preferably made of a material such as absorptive cotton, which will retain a considerable amount of corrosion-inhibiting fluid and will bleed the fluid over an extended period of time onto the conductive gasket 14. The conductive gasket 14 is preferably knitted or woven wire mesh, of a mesh size sufficiently small to maintain its effectiveness as a conductor for electromagnetic interference shielding in the enclosure of FIG. 2 (although allowing the fluid to pass therethrough). The corrosion resistant shielding gasket 10 illustrated in FIG. 1 will require maintenance only at infrequent intervals over an extended period of time, while preventing corrosion from galvanic action of the conductive gasket material with the material utilized in the enclosure.

Figure 2:
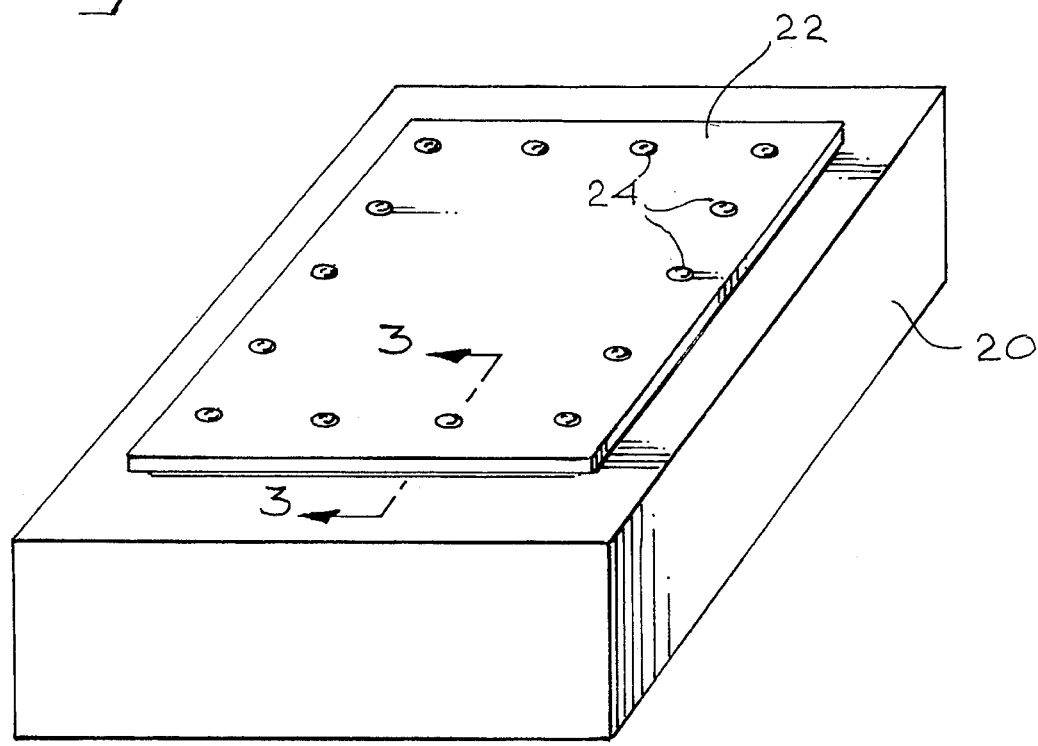
FIG. 2 is a perspective view of an enclosure with a door panel attached to show the use of arrangements of the present invention.

In FIG. 2, a typical shielding enclosure 20 is illustrated. The shielding enclosure 20 has an access opening closed with a door panel 22, which is fastened to the enclosure 20 by a plurality of fasteners 24. It will be understood that the gasket 10 will be placed around the aperture in the shielded enclosure 20 with the ends of the gasket 10 adjoining to complete the electromagnetic shield.

Figure 3:
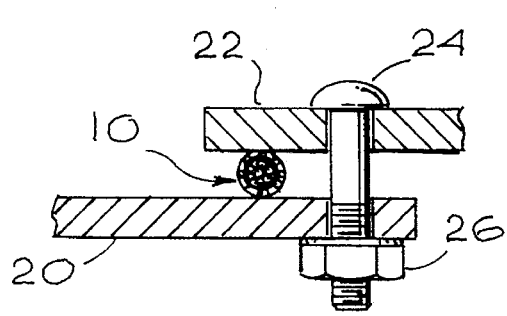
FIG. 3 is a cross-sectional view of a portion of the enclosure and door panel of FIG. 2 with the conductive gasket of FIG. 1 installed therebetween before the door panel has been tightly fastened to the enclosure.
Figure 4:
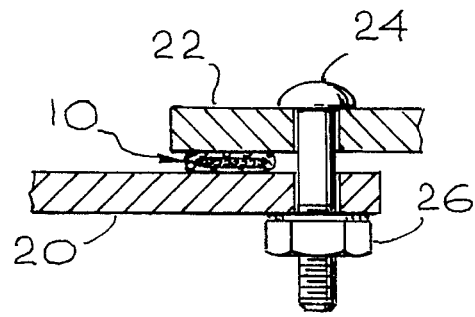
FIG. 4 is a cross-sectional view as in FIG. 3 with the door panel tightly fastened to the enclosure, compressing the conductive gasket of FIG. 1.

As best shown in FIGS. 3 and 4, the corrosion-resistant shielding gasket 10 is installed between the door panel 22 and the shielded enclosure 20 at a location adjacent the bolts 24. The corrosion-resistant shielding gasket 10 is installed in place, and the bolts 24 are fastened to the nuts 26 to compress the shielding gasket 10 as shown in FIG. 4, thereby resulting in virtually complete shielding of electrical components contained in the shielded enclosure 20 from an electromagnetic environment outside the enclosure 20. The retaining medium 12 is saturated with corrosion-inhibiting fluid such as water repellent oil before the shielding gasket 10 is installed between the door panel 22 and the enclosure 20. Such initial saturation may be accomplished by simply placing the assembled shielding gasket 10 in a container of the corrosion-inhibiting fluid, removing it, and allowing the excess to either drip or be wiped away.

In FIGS. 5 and 6, an alternative embodiment of the present invention is illustrated which will also provide a combination moisture-proof seal and conducting, corrosion-inhibiting gasket between the door panel 22 and the shielded enclosure 20. A shielding gasket 30 made of the retaining medium 12 which is saturated with a corrosion-inhibiting fluid and located within a conductive gasket portion 14 is adhesively attached to an elastomeric strip 32, preferably by a flexible adhesive to allow flexing of the shielding gasket 30. When the shielding gasket 30 is installed between the door panel 22 and the shielding enclosure 20, in addition to compressing the conductive gasket 14 the door panel 22 will compress the elastomeric strip 32 against the shielded enclosure 20, thereby resulting in a moisture-proof seal.

In FIGS. 7 and 8, an alternative embodiment is shown utilizing a larger diameter conductive gasket 14 containing therein the retaining medium 12 which is saturated with the corrosion-inhibiting fluid. A portion of the diameter of the conductive gasket 14 is squeezed together between the arms of a Y-shaped strip of metal 38, and when the arms of the Y-shaped strip of metal 38 are squeezed together the resulting shielding gasket 40 will appear as illustrated in FIG. 8. Such a shielding gasket 40 is useful in applications requiring a stiffer gasket than those shown in FIGS. 1 or 5.

A third embodiment is illustrated in FIG. 9, where spiral conductive gasket 44 is utilized instead of knitted or woven wire. The spiral conductive gasket 14 is made of thin, flat and relatively narrow metal which is both conductive and resilient (typically spring metal), and is typically attached to an elastomeric strip 32. The spiral conductive gasket 44 is provided with a retaining medium 12 located within the spiral conductive gasket 44 and containing the corrosion-inhibiting fluid. This medium 12 may be a fabric wick material or it may be an elastomeric member formed of open cell sponge material to retain the corrosion-inhibiting liquid, thereby serving as a reservoir for the liquid and releasing it slowly over a long period of time.

Still another embodiment is represented schematically in FIG. 10, of which FIG. 10A represents a broken away section. FIG. 10 shows a segment of a strip sealing gasket 50 which, when mounted in place of the member 10 between the enclosure and panel of FIGS. 3 and 4, provides the desired electrically conductive, corrosion-inhibiting seal for the shield enclosure 20, 22. The seal 50 is formed of soft silicone sponge material with the bubble cells within the sponge material being open—that is, connected with each other to form channels to the surface and throughout the material. These bubble cells are represented by the tiny circles 52 on the surfaces of the sealing gasket 50. This material is provided with a multitude of convoluted wires 54, shown in FIG. 10A as extending between opposite faces 56, 58 of the gasket 50. These wires, which are preferably of monel or an aluminum alloy, are chemically bonded within the silicone sponge elastomer. The wires 54 are convoluted to allow compressing and rebounding like individual springs. The seal 50 has its cells 52 filled with a suitable water repellent oil which bleeds out of the cells 52 over an extended period of time to maintain a protective film over the interfacing dissimilar metals, thus extending the maintenance period substantially.

It may therefore be appreciated that the present invention in its various embodiments provides a corrosion-resistant shielding gasket which may be utilized in a corrosive environment to provide an excellent electromagnetic shielding effect between a door panel and an enclosure. The corrosion resistant shielding gasket of the present invention need be maintained only at infrequent intervals over extended periods, thereby minimizing maintenance requirements. In addition, since the present invention may be manufactured economically and installed easily, it will be appreciated that the substantial benefits accorded are available at extremely low cost, thereby making the present invention a highly desirable component for use in shielding high technology electronic equipment from electromagnetic interference.

Although there have been described above specific arrangements of a corrosion resistant electromagnetic shielding gasket in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. A method of ensuring a corrosion-resistant electromagnetic shield between a metal enclosure having an aperture and a metal door panel to close said aperture, said method comprising:

provididing a tubular conductive gasket material which is permeable to fluids but not to electromagnetic radiation comprising winding a narrow strip of thin metal in spiral fashion around a diameter to form a tubular structure, said gasket material comprising a metallic knitted wire fabric of a mesh size sufficiently small to prevent the passage therethrough of electromagnetic radiation, and sufficiently large to allow the passage therethrough of a corrosion-inhibiting fluid;

disposing inside said tubular conductive gasket material a fluid retaining medium, said fluid retaining. medium running the length of said tubular conductive gasket material;

soaking said tubular gasket material containing said fluid retaining medium in said corrosion-inhibiting fluid to allow said fluid retaining medium to become saturated with said corrosion-inhibiting fluid;

placing said tubular conductive gasket material containing said fluid retaining medium saturated with said corrosion-inhibiting fluid between said metal enclosure and said metal door panel to surround said aperture in said metal enclosure; and fastening said metal door panel to said metal enclosure; thereby compressing said tubular conductive gasket material to provide an electromagnetic shield between said metal enclosure and said metal door panel while permitting said fluid to bleed outwardly from said medium through the permeable gasket material to protect adjacent surfaces of said metal enclosure and door panel against corrosion.

\* \* \* \* \*